(12) United States Patent
Gäbler et al.

(10) Patent No.: US 11,605,742 B2
(45) Date of Patent: Mar. 14, 2023

(54) DARK REFERENCE DEVICE FOR IMPROVED DARK CURRENT MATCHING

(71) Applicant: X-FAB Global Services GmbH, Erfurt (DE)

(72) Inventors: Daniel Gäbler, Apolda (DE); Pablo Siles, Erfurt (DE)

(73) Assignee: X-FAB Global Services GmbH, Erfurt (DE)

( * ) Notice: Subject to any disclaimer, the term of this patent is extended or adjusted under 35 U.S.C. 154(b) by 0 days.

(21) Appl. No.: 17/350,354

(22) Filed: Jun. 17, 2021

(65) Prior Publication Data

US 2021/0399149 A1   Dec. 23, 2021

(30) Foreign Application Priority Data

Jun. 18, 2020   (GB) ...................... 2009326

(51) Int. Cl.
*H01L 31/0216*   (2014.01)
*H01L 31/02*   (2006.01)

(52) U.S. Cl.
CPC .. *H01L 31/02164* (2013.01); *H01L 31/02005* (2013.01)

(58) Field of Classification Search
CPC ......... H01L 31/02164; H01L 31/02005; H01L 27/14623
See application file for complete search history.

(56) References Cited

U.S. PATENT DOCUMENTS

| | | | |
|---|---|---|---|
| 6,278,169 B1* | 8/2001 | Sayuk | H01L 27/14623 257/435 |
| 10,074,681 B2* | 9/2018 | Cao | H01L 27/14623 |
| 2006/0060899 A1* | 3/2006 | Hong | H01L 27/14623 438/70 |
| 2008/0105908 A1* | 5/2008 | Lee | H01L 27/14632 257/E31.127 |
| 2009/0184386 A1* | 7/2009 | Kobayashi | H01L 27/14623 438/73 |
| 2009/0189236 A1* | 7/2009 | Hayashi | H01L 31/0216 257/E31.127 |

FOREIGN PATENT DOCUMENTS

GB   2529567   2/2016

OTHER PUBLICATIONS

United Kingdom Combined Search and Examination Report for corresponding GB Application No. GB2009326.6, dated Nov. 13, 2020, 7 pages.

* cited by examiner

*Primary Examiner* — Hoang-Quan Ho
(74) *Attorney, Agent, or Firm* — Dority & Manning, PA

(57) ABSTRACT

A dark reference device comprises:
 a photodiode comprising an optical active area;
 a light shield configured to prevent light from entering said optical active area, wherein said light shield comprises first and second overlapping metal covers, and wherein each of said metal covers comprises a plurality of openings overlapping said optical active area.

15 Claims, 6 Drawing Sheets

DARK REFERENCE DEVICE FOR IMPROVED DARK CURRENT MATCHING

CROSS REFERENCE TO RELATED APPLICATIONS

This application claims priority to United Kingdom Patent Application No. 2009326.6 having a filing date of Jun. 18, 2020, which is incorporated herein by reference.

TECHNICAL FIELD

The invention relates to photodiode layouts for improving dark current matching.

BACKGROUND

The dark current sets the "noise" limit for low light situations, and is highly temperature dependent. If the dark current is known, the noise floor can be pushed lower, by subtracting the current of a dark reference device (a similar photodiode which is insensitive to light) from the sensor current. A metal cover for blocking incident light is used to build the dark reference device.

Any mismatch in the dark current behaviour between the normal (light sensitive) photodiodes and the dark reference device degrades the performance. The current direction can even be swapped if the dark current of the reference device is larger than that of the photodiodes, causing the read out circuit to fail.

SUMMARY

Aspects of the invention provide a dark reference device, an optical sensor and methods of manufacturing a dark reference device as set out in the claims.

Preferred embodiments of the invention will now be described with reference to the accompanying drawings.

DETAILED DESCRIPTION

Embodiments described herein provide a dark reference device with improved dark current matching. The metal cover of a dark reference device affects the dark current, which can lead to a significant dark current mismatch between the light sensitive photodiodes and the dark reference device. However, the effect of the metal cover on the dark current can be reduced by using two overlapping metal covers comprising openings.

Figure 1:
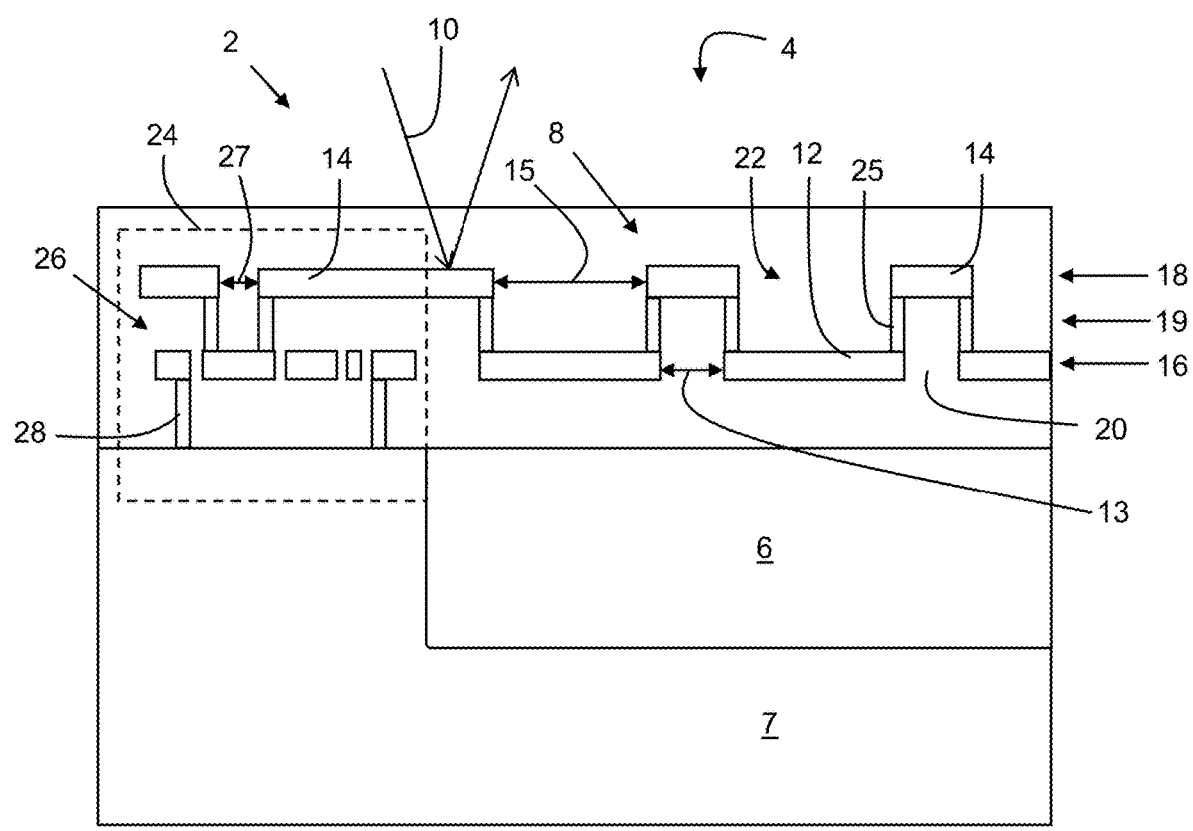
FIG. 1 shows a schematic cross section of a part of a dark reference device according to an embodiment.

FIG. 1 shows a cross section of a part of a dark reference device 2 according to an embodiment. The dark reference device comprises a photodiode 4 having an optical active area 6 in a substrate 7. Excited charge carriers in the optical active area 6 give rise to a measurable current. A light shield 8 is arranged over the optical active area 6 to prevent light 10 from entering the optical active area 6. The light shield 8 comprises two overlapping metal covers 12 and 14 in respective metal layers 16 and 18 separated by an interdielectric layer 19. Each metal cover 12 and 14 comprises a plurality of openings 20 and 22 being slots, but the openings 20 and 22 of respective covers 12 and 14 do not overlap, so that the two metal covers 12 and 14 together provide 100% coverage of the optical active area 6. The openings 20 of the first metal cover 12 have a width 13 in the range of 1 μm to 5 μm, and the openings 22 of the second metal cover 14 have a width 15 in the range of 4 μm to 10 μm. The width 13 and 15 of all openings 20 and 22 overlapping the optical active area 6 of any one of the metal covers 12 and 14 may be the same. The openings 20 in the first metal cover 12 are enclosed by lines of vias 25 so that the light shield 8 comprises a continuous metal barrier. The peripheral region 24 surrounding the optical active area 6 comprises a contact structure 26 with contacts 28 for connecting to the photodiode 4. The second metal cover 14 extends over a part of the peripheral region 24, which can further improve the dark current matching. The width 27 of openings in the metal covers 12 and 14 overlapping the peripheral region 24 may differ from the width 13 and 15 of openings 20 and 22 overlapping the optical active area 6.

Figure 2:
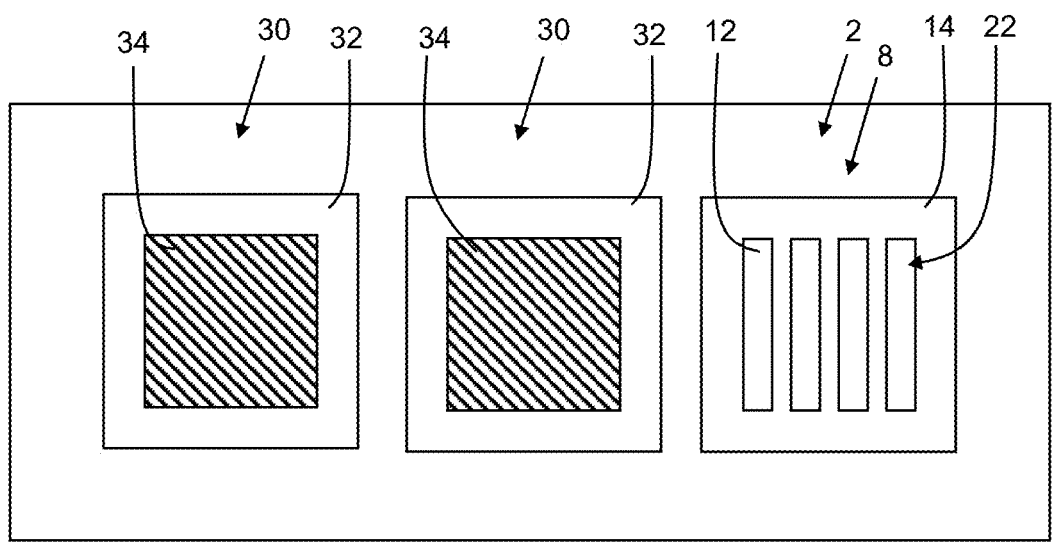
FIG. 2 shows a schematic top view of a part of an optical sensor comprising a dark reference device according to an embodiment.

FIG. 2 shows a schematic cross-sectional top view of a part of an optical sensor comprising two "normal", light sensitive photodiodes 30 and a dark reference device 2. The same reference numerals have been used for similar or equivalent features in different figures to aid understanding and are not intended to limit the illustrated embodiments. In use, the current of the dark reference device is subtracted from the current of the normal photodiodes. The normal photodiodes 30 have a light shield 32 covering the peripheral region, while leaving the optical active area 34 for detecting incident light exposed. The dark reference device 2 also comprises a light shield 8 comprising an upper metal cover 14 with a plurality of openings 22 in it and lower metal cover 12. The openings 22 in the upper metal cover 14 overlap the underlying metal cover 12 of the light shield, so that the entire optical active area of the dark reference device is covered. The first metal cover 12 also comprises openings 20, but these cannot be seen in FIG. 2, because the openings 20 and 22 in the two metal covers 12 and 14 do not overlap. The normal photodiodes and the dark reference device are substantially identical apart from the different light shields 32 and 8. The light shield 8 of the dark reference device 2 provides the same amount of cover as a single continuous metal cover, but with improved dark current matching to the normal photodiodes 30.

Figure 3:
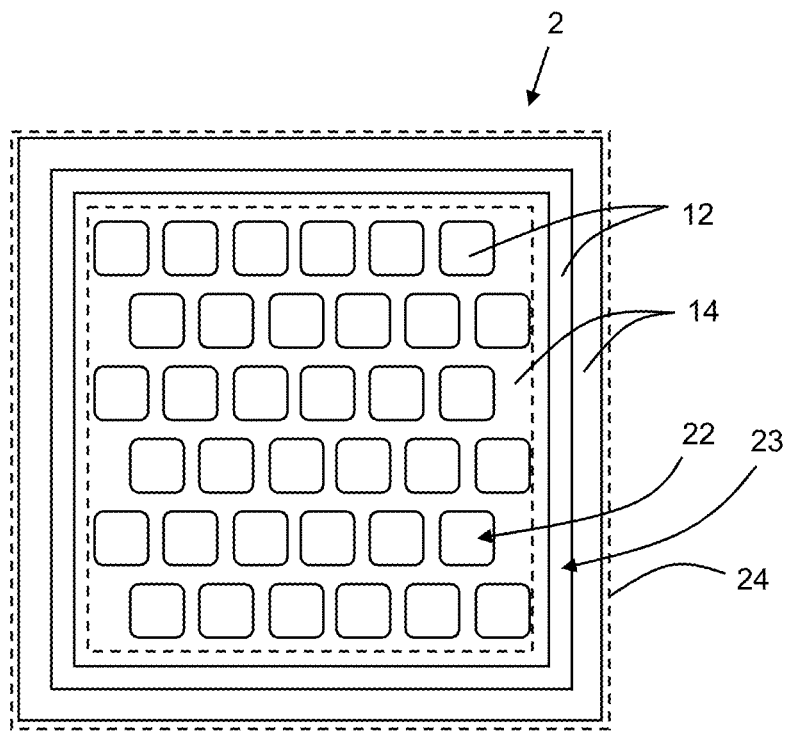
FIG. 3 shows a schematic diagram of a dark reference device according to an embodiment having square openings.

FIG. 3 shows a schematic diagram of another embodiment of the dark reference device 2. The device 2 comprises a first metal cover 12 (Metal 1) under a second metal cover 14 (Metal 2). The second metal cover 14 comprises an array of openings 22 having a square shape over the optical active area. The dashed lines indicate the peripheral region 24 of the device 2. The first and second metal covers 12 and 14 extend over the peripheral region 24. An opening 23 overlapping the peripheral region 24 surrounds the optical active area. Electrical connections must be done and routed outside the device 2. Since the metal cover openings 22 and 23 in the second metal cover 14 are closed with metal pieces in the first metal cover 12, there can be no other metal structures in the same area for the purpose of electrical connections or wiring. The shape of the opening 23 in the peripheral region 24 is therefore different from the openings 22 overlapping the optical active area, in order to accommodate the contact structures comprised by Metal 1.

Figure 4:
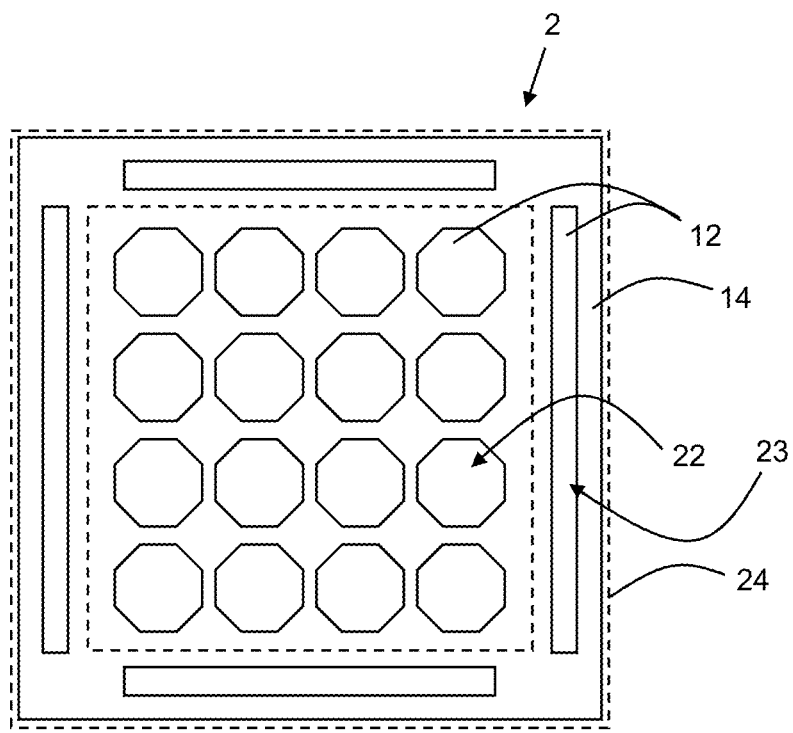
FIG. 4 shows a schematic diagram of a dark reference device according to an embodiment having octagonal openings.

FIG. 4 similarly shows a schematic diagram of another embodiment of the dark reference device 2, in which the openings 22 over the optical active area in the second metal cover 14 have an octagonal shape. Again, the first and second metal covers 12 and 14 extend over the peripheral region 24. The second metal cover 14 comprises rectangular slots 23 overlapping the peripheral region 24.

Figure 5:
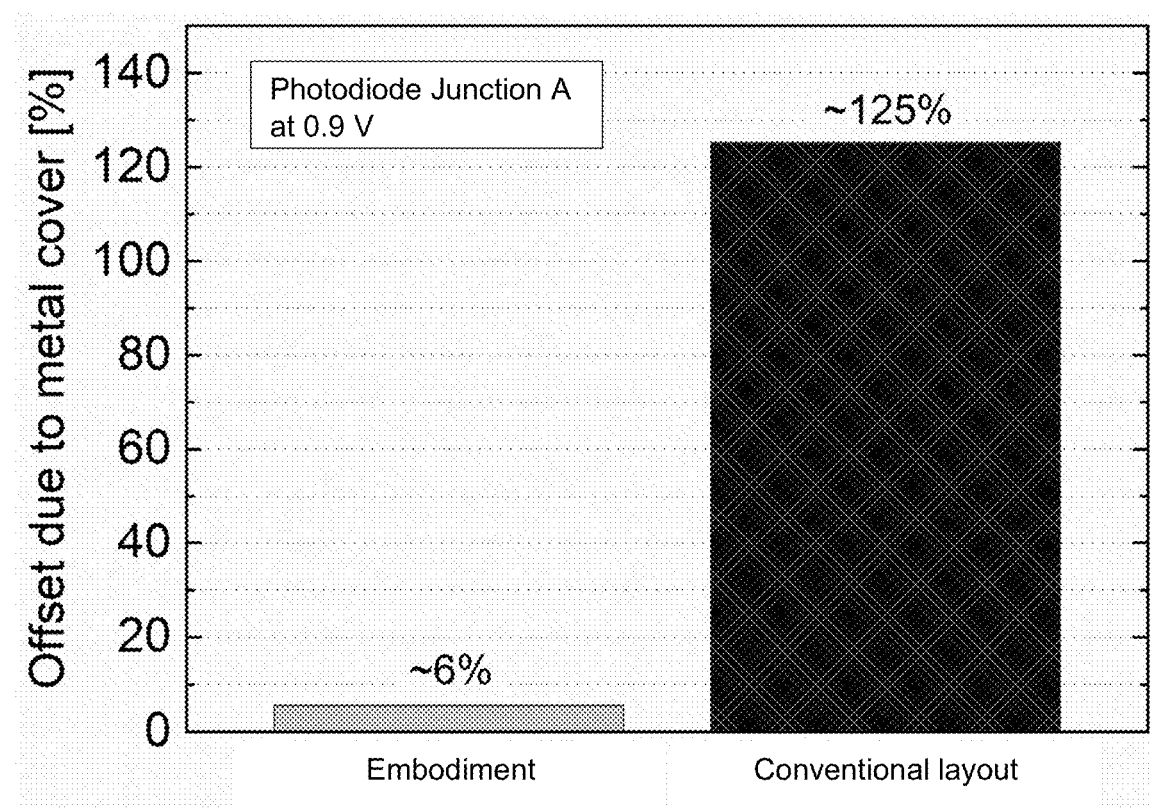
FIG. 5 shows a graph illustrating the dark current mismatch.

FIG. 5 shows a graph illustrating the dark current mismatch for a dark reference device according to an embodiment compared to dark reference device having a conventional layout. The percentage offset in the dark current introduced by the metal cover(s) is about 6% for the embodiment having a slotted metal cover, and about 125% for a conventional (continuous) metal cover. Both devices had the same type of photodiode junction (referred to as junction A) and were operated at 0.9 V.

Figure 6:
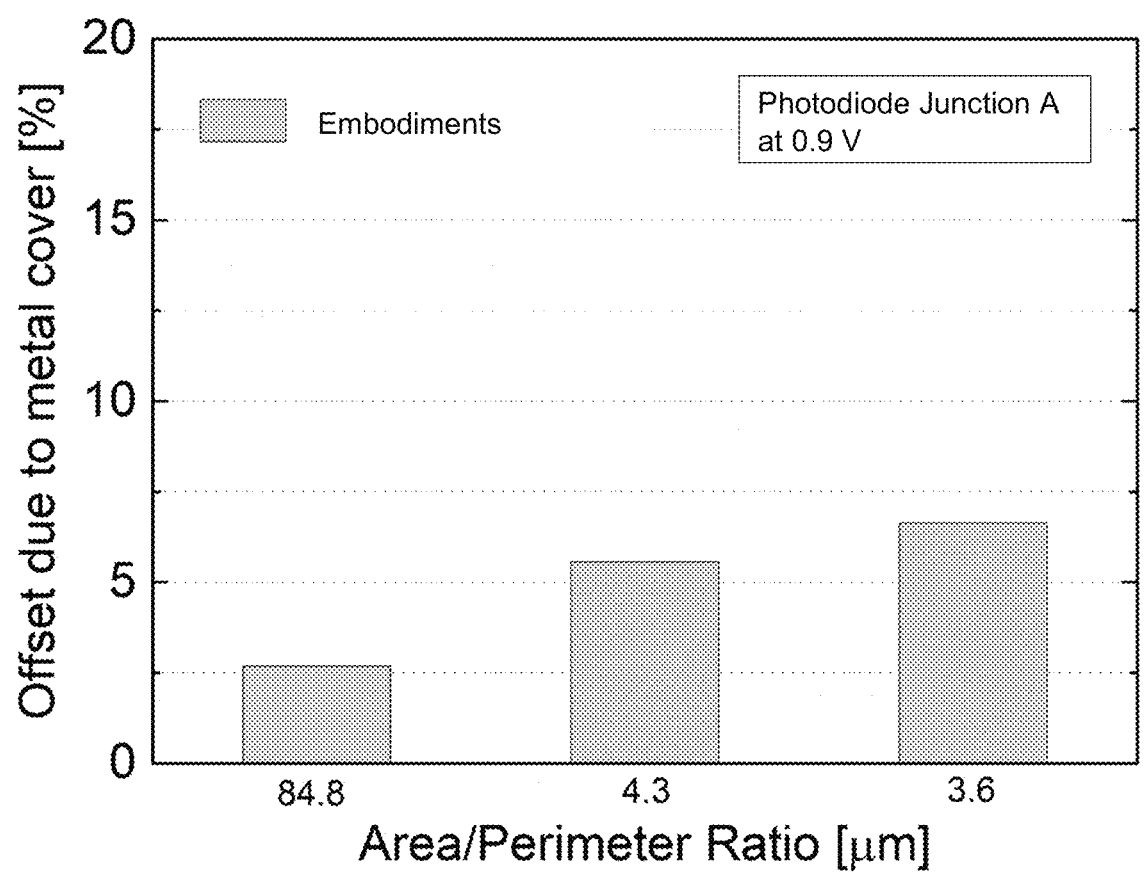
FIG. 6 shows a graph illustrating the dark current mismatch for devices of different sizes.

FIG. 6 shows a graph illustrating the dark current mismatch for three different embodiments of the dark reference device. Each device comprises the same type of photodiode junction (junction A) and was operated at 0.9 V, but the area to perimeter ratio of the optical active area differed between the devices. The ratio was 84.8 µm (large device), 4.3 µm and 3.6 µm. As can be seen from the graph, the dark current offset introduced by the metal covers decreased with increasing area to perimeter ratio. However, for all three devices the offset was below 7.5%, which is a significant improvement over the performance of a conventional layout (as seen in FIG. 3).

Figure 7:
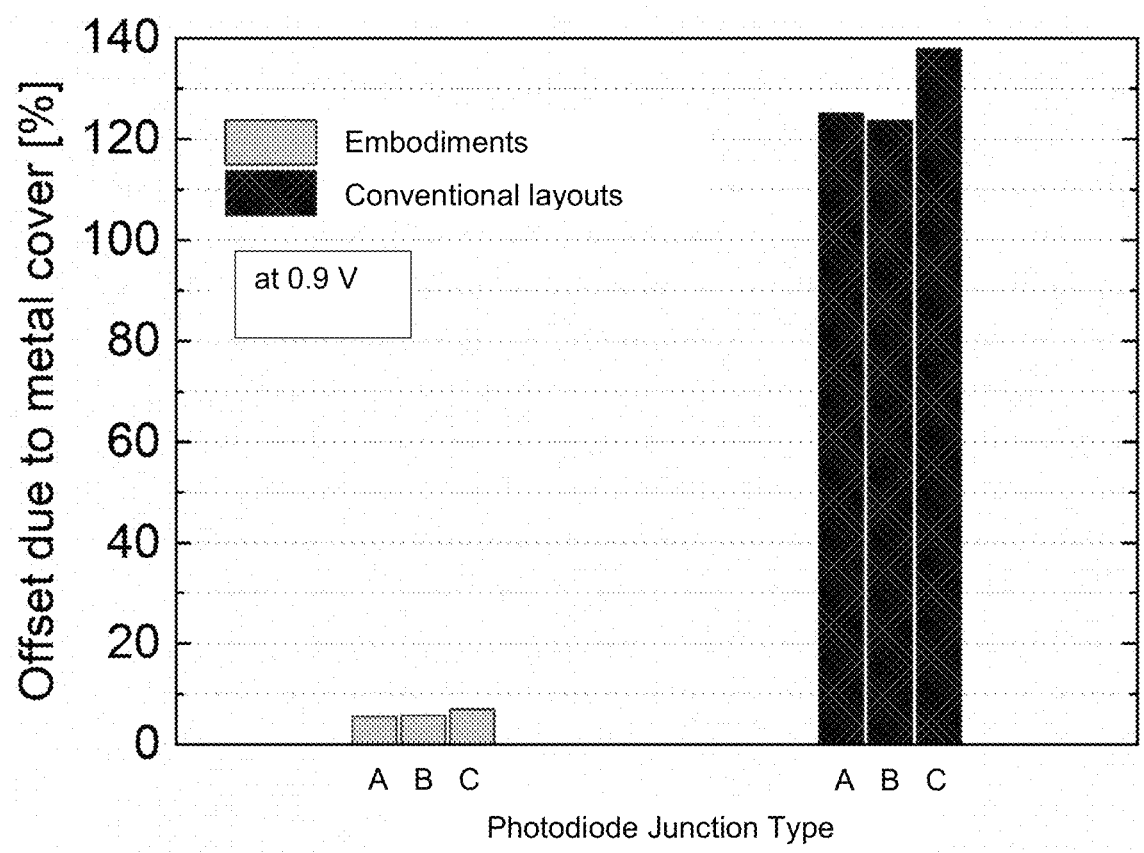
FIG. 7 shows a graph illustrating the dark current mismatch for devices having different photodiode junction types.

FIG. 7 shows a graph illustrating the dark current mismatch for three different embodiments having the same area to perimeter ratio but different photodiode junction types (junction A, B and C respectively). The different junction types tested correspond to shallow junctions, deeper wells, and dual junctions. The solution provided improved dark current matching for all the tested junction types. The performance of dark reference devices with a conventional layout having the same types of photodiode junction types is also plotted for comparison. The dark reference devices according to embodiments with the slotted metal cover perform significantly better for all three types of photodiode junctions.

In general, embodiments described herein provide a dark reference device comprising a photodiode with an optical active area and a light shield, which is configured to prevent light from entering the optical active area (i.e. to prevent any light induced charge carriers). The light shield comprises two overlapping metal covers, each metal cover comprising a plurality of openings overlapping the optical active area (instead of using a single continuous metal cover). The interrupted metal covers can provide significant improvements in the dark current matching compared to conventional layouts. The two metal coves may be comprised by two metal layers separated by an interdielectric layer, such as Metal 1 and Metal 2 of a CMOS backend stack. The metal covers may be grounded and may be connected by vias. Preferably, the vias comprise lines of vias around the openings in the first metal cover, so as to provide a continuous metal barrier together with the second metal cover.

The light shield is typically configured to prevent light from entering the peripheral region around the optical active area as well. At least one of the first and second metal covers may extend over a part of the peripheral region. In general, the openings/slots in the metal covers also overlap the peripheral region (i.e. the slotted cover extends over at least a part of the peripheral region). This can further reduce the dark current mismatch. One of the metal covers (e.g. the lowermost) may cover between 50% and 90% of the optical active area. The second metal cover may then cover between 10% and 50% of the optical active area, such that both metal covers together cover 100% of the optical active area. The openings in the metal covers may have a rectangular shape (i.e. forming slots) having a width in the range of 1 µm to 20 µm, depending on the size of the photodiode. The length of the slots may be substantially equal to the length of the underlying optical active area. In preferred embodiments, one or both metal covers comprise square openings (i.e. slots having equal width and length), circular openings, or octagonal openings, which can provide improved symmetry and can allow filling/patterning of the metal layer with a single "slot-cell" that is repeated until the desired area of the photodiode is filled with openings. The circular shapes may have a diameter in the range of 1 µm to 20 µm. The square shapes can have rounded corners. Typically, different types of openings (i.e. in terms of shape and/or size) overlap the optical active area and the peripheral region. In particular, openings overlapping the peripheral region are preferably shaped and positioned so as to accommodate contact structures comprised by the underlying metal layer. Openings having other shapes can also be used, including shapes similar to those described above, such as squares with more rounded corners. Having openings (e.g. rectangular slots) in the metal covers allows for easier compliance with metal density rules, which can otherwise be difficult especially for large area devices (e.g. >100 µm width). In CMOS device manufacturing, the density of metal in a layer has a minimum and a maximum constraint, because the density affects etch rates and because large variations in density can cause thermal expansion stress. For example, the metal density rules may constraint the area density of metal to between 30% and 80%.

The photodiode can have an area to perimeter ratio (defined as area divided by perimeter) in the range of 1 µm to 250 µm. For example, a 10×10 µm$^2$ photodiode has an area of 100 µm$^2$ and a perimeter of 40 µm so the area to perimeter ratio is 2.5 µm. A 100×100 µm$^2$ photodiode has an area of 1000 µm$^2$ and an perimeter of 400 µm which results in a ratio of 25 µm. The dark current mismatch may be lower for large area to perimeter devices (e.g. photodiodes having an area to perimeter ratio in the range of 50 µm to 250 µm).

The dark reference device may be a part of an optical sensor comprising a plurality of normal (light sensitive) photodiodes. In use, the output from the dark reference device in the optical sensor is subtracted from the output from each of the normal photodiodes in the sensor. The optical sensor may comprise a plurality of dark reference devices as described herein.

Embodiments described herein also provide a method of making a dark reference device. The method comprises providing a photodiode with an optical active area, and providing a light shield configured to prevent light from entering the optical active area, wherein the light shield comprises first and second overlapping metal covers, and wherein each of the metal covers comprises a plurality of openings.

The step of providing the light shield may comprise depositing a first metal layer and patterning the first metal layer to form the first metal cover, forming lines of vias around said openings in said first metal layer; and depositing a second metal layer and patterning the second metal layer to form the second metal cover. The lines of vias connect the two metal covers while also providing a continuous metal cover without gaps to prevent light penetration. Typically, the method is performed in a CMOS process.

While specific embodiments of the invention have been described above, it will be appreciated that the invention may be practiced otherwise than as described. The descriptions above are intended to be illustrative, not limiting. It will be apparent to one skilled in the art that modifications may be made to the invention as described without departing from the scope of the claims set out below.

Each feature disclosed or illustrated in the present specification may be incorporated in the invention, whether alone or in any appropriate combination with any other feature disclosed or illustrated herein.

The invention claimed is:

1. A dark reference device comprising:
  a photodiode comprising an optical active area;
  a peripheral region around said optical active area and comprising one or more contact structures;
  a light shield configured to prevent light from entering said optical active area and from entering said peripheral region, wherein said light shield comprises first and second overlapping metal covers, and wherein each of said metal covers comprises a plurality of openings overlapping said optical active area and wherein at least one of said first and second metal covers extends over at least a part of said peripheral region and comprises one or more openings overlapping said peripheral region, and wherein said first and second metal covers are connected by vias being lines of vias around said plurality of openings in said first metal cover, so as to provide a continuous metal barrier together with said second metal cover.

2. The dark reference device of claim 1, wherein none of the openings in the second metal cover overlaps an opening in the first metal cover.

3. The dark reference device of claim 1, further comprising first and second metal layers separated by an interdielectric layer, wherein said first metal layer comprises said first metal cover and said second metal layer comprises said second metal cover.

4. The dark reference device of claim 3, wherein said first metal layer is Metal 1 of a complementary metal oxide semiconductor (CMOS) backend stack and said second metal layer is Metal 2 of said CMOS backend stack.

5. The dark reference device of claim 1, wherein said first metal cover covers between 50% and 90% of said optical active area.

6. The dark reference device of claim 5, wherein said second metal cover covers between 10% and 50% of said optical active area, and wherein said first and second metal covers together cover 100% of said optical active area.

7. The dark reference device of claim 1, wherein one or more of said openings overlapping the optical active area in of said first and second metal covers have rectangular shapes.

8. The dark reference device of claim 7, wherein a width of the rectangular shapes is in the range of 1 µm to 20 µm.

9. The dark reference device of claim 7, wherein said rectangular shapes are square shapes.

10. The dark reference device of claim 1, wherein one or more of said openings overlapping the optical active area in said first and second metal covers have one of circular shapes and octagonal shapes.

11. The dark reference device of claim 1, wherein said first and second metal covers are grounded and connected by vias.

12. The dark reference device of claim 1, wherein said photodiode has an area to perimeter ratio in the range of 50 µm to 250 µm.

13. An optical sensor comprising a plurality of light sensitive photodiodes and a dark reference device according to claim 1.

14. A method of making a dark reference device comprising:
  providing a photodiode comprising an optical active area;
  providing a peripheral region around said optical active area and comprising one or more contact structures; and
  providing a light shield configured to prevent light from entering said optical active area and from entering said peripheral region, wherein said light shield comprises first and second overlapping metal covers, and wherein each of said metal covers comprises a plurality of openings overlapping said optical active area, and wherein at least one of said first and second metal covers extends over at least a part of said peripheral region and comprises one or more openings overlapping said peripheral region, and wherein said first and second metal covers are connected by vias being lines of vias around said plurality of openings in said first metal cover, so as to provide a continuous metal barrier together with said second metal cover.

15. The method of claim 14, wherein providing said light shield comprises:
  depositing a first metal layer and patterning said first metal layer to form said first metal cover;
  forming lines of vias around said openings in said first metal layer; and
  depositing a second metal layer and patterning said second metal layer to form said second metal cover.

* * * * *